United States Patent [19]

Valente et al.

[11] Patent Number: 5,244,691
[45] Date of Patent: Sep. 14, 1993

[54] PROCESS FOR DEPOSITING A THIN LAYER OF A CERAMIC COMPOSITION AND A PRODUCT OBTAINED THEREBY

[75] Inventors: Isabelle (wife Campion) Valente, Champaign, Ill.; Sylvain Faure, Orsay, France; Philippe Gaucher, Gif s/Yvette, France; Jacques Livage, Bures s/Yvette, France

[73] Assignee: Thomson-CSF, Puteaux, France

[21] Appl. No.: 616,081

[22] Filed: Nov. 20, 1990

[30] Foreign Application Priority Data

Nov. 20, 1989 [FR] France .................. 8915174

[51] Int. Cl.$^5$ ............................ B05D 5/12
[52] U.S. Cl. ................. 427/126.2; 427/226; 427/404; 427/419.1; 428/457
[58] Field of Search ............. 65/901; 428/689, 702; 501/137, 12, 134; 427/126.3, 419.1–419.8; 156/89; 544/185

[56] References Cited

U.S. PATENT DOCUMENTS

| | | | |
|---|---|---|---|
| 4,481,134 | 11/1984 | Angelini et al. | 264/0.5 |
| 4,485,094 | 11/1984 | Rubler | 427/87 |
| 4,886,654 | 12/1989 | Ohga et al. | 501/137 |
| 4,913,708 | 4/1990 | Kalinowski | 51/309 |
| 4,937,208 | 6/1990 | Yamamoto | 501/12 |
| 4,946,710 | 8/1990 | Miller et al. | 427/126.3 |
| 4,960,618 | 10/1990 | Tanitsu et al. | 427/126.3 |

OTHER PUBLICATIONS

Proceedings of the 6. IEEE International Symposium on Applications of Ferroelectronics, Vest et al, "PbTiO$_3$ Films . . . Precursors".
Patent Abstracts of Japan vol. 13, No. 63 (C-568) (3411) Feb. 13, 1989 and JP-A-63255375.
Sanchez et al. "Sol-Gel Chemistry from Metal Oxide Precursors" New J. Chem. 14(1990) pp. 513–521.
Sakka et al. "Preparation of Glasses and Ceramics for Electrical Use Based on Alkoxide and Unidirectional Solidification Methods" Jap. J. Appl. Phys. 22 (1983) Supp. 22-2 pp. 3–7.
Sayer et al. "Ceramic Thin Films: Fabrication and Applications" Science, 247 (1990), pp. 1056–1060.

*Primary Examiner*—Patrick J. Ryan
*Assistant Examiner*—Patrick R. Jewik
*Attorney, Agent, or Firm*—Oblon, Spivak, McClelland, Maier & Neustadt

[57] ABSTRACT

A process for depositing a thin layer of a ceramic composition on a substrate, which comprises:
a) dissolving basic constituents of the ceramic composition, which are added in simple or mixed form to a solvent;
b) adding to the solution, acetylacetone and hexamethylene tetramine in proportions suitable to the deposit method used;
c) maturing or polymerizing the substance obtained in step b);
d) depositing a layer of the substance on a substrate;
e) drying the deposited layer, and
f) sintering the layer deposited at low temperature.

6 Claims, 3 Drawing Sheets

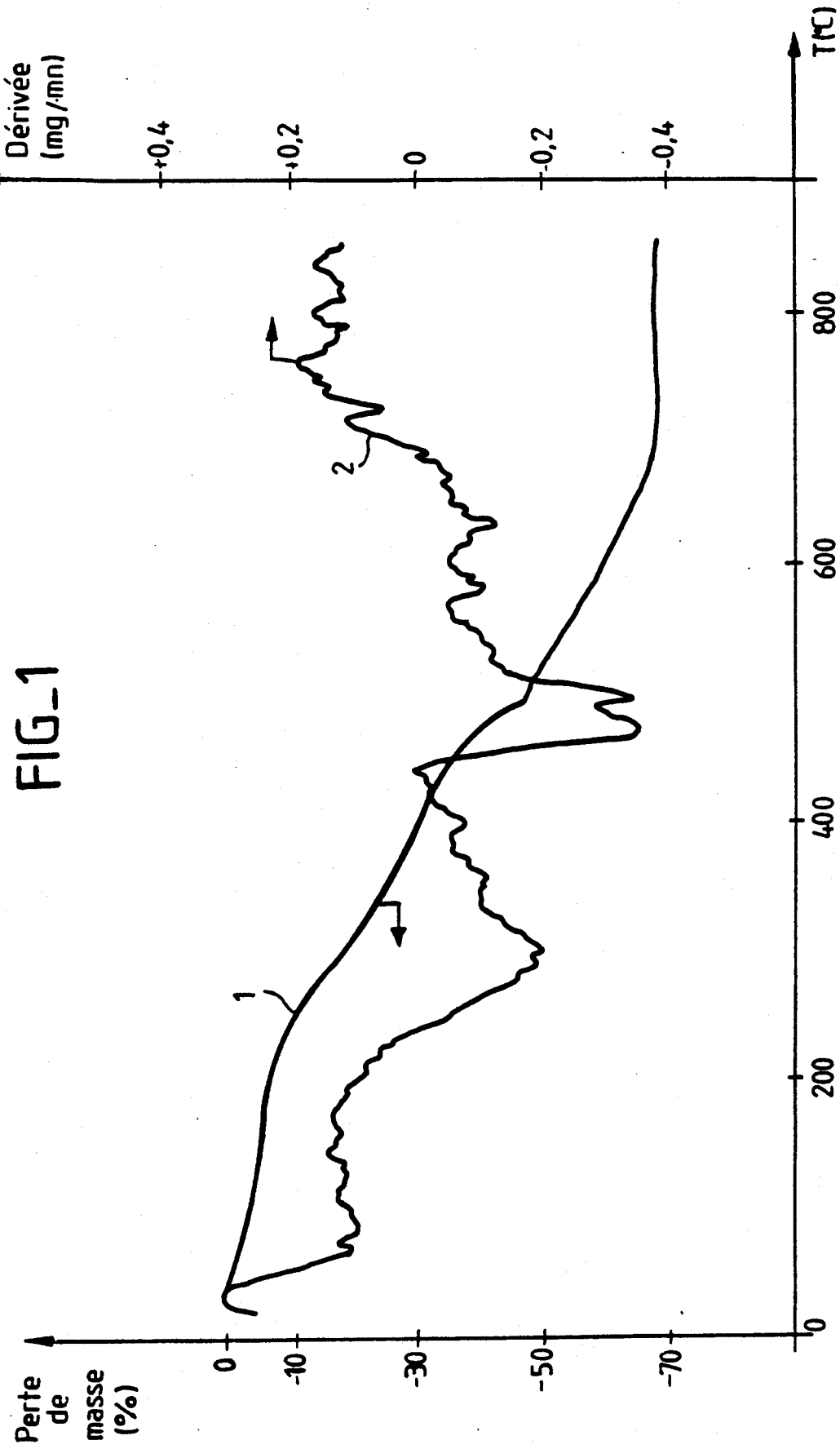
FIG_1

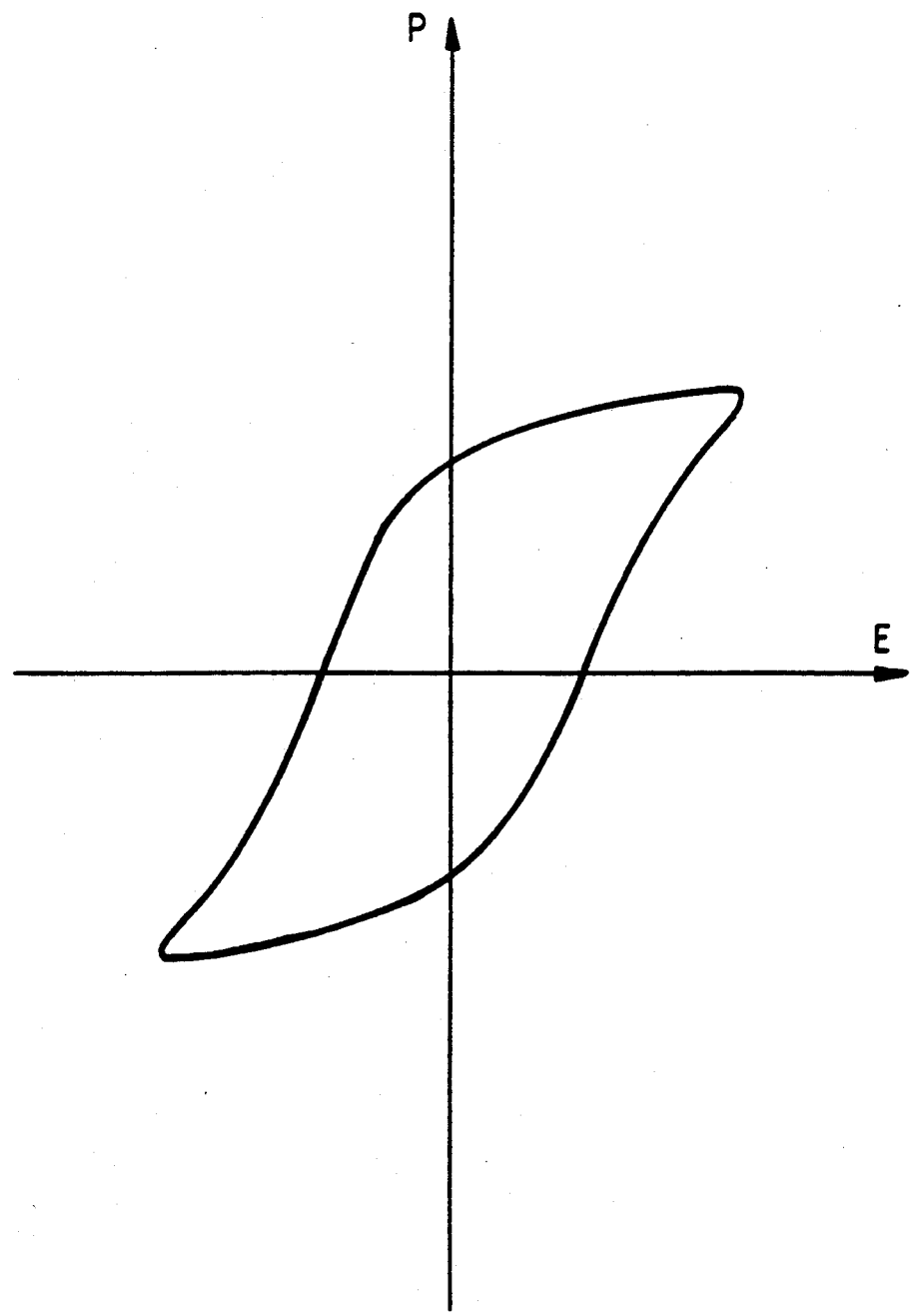

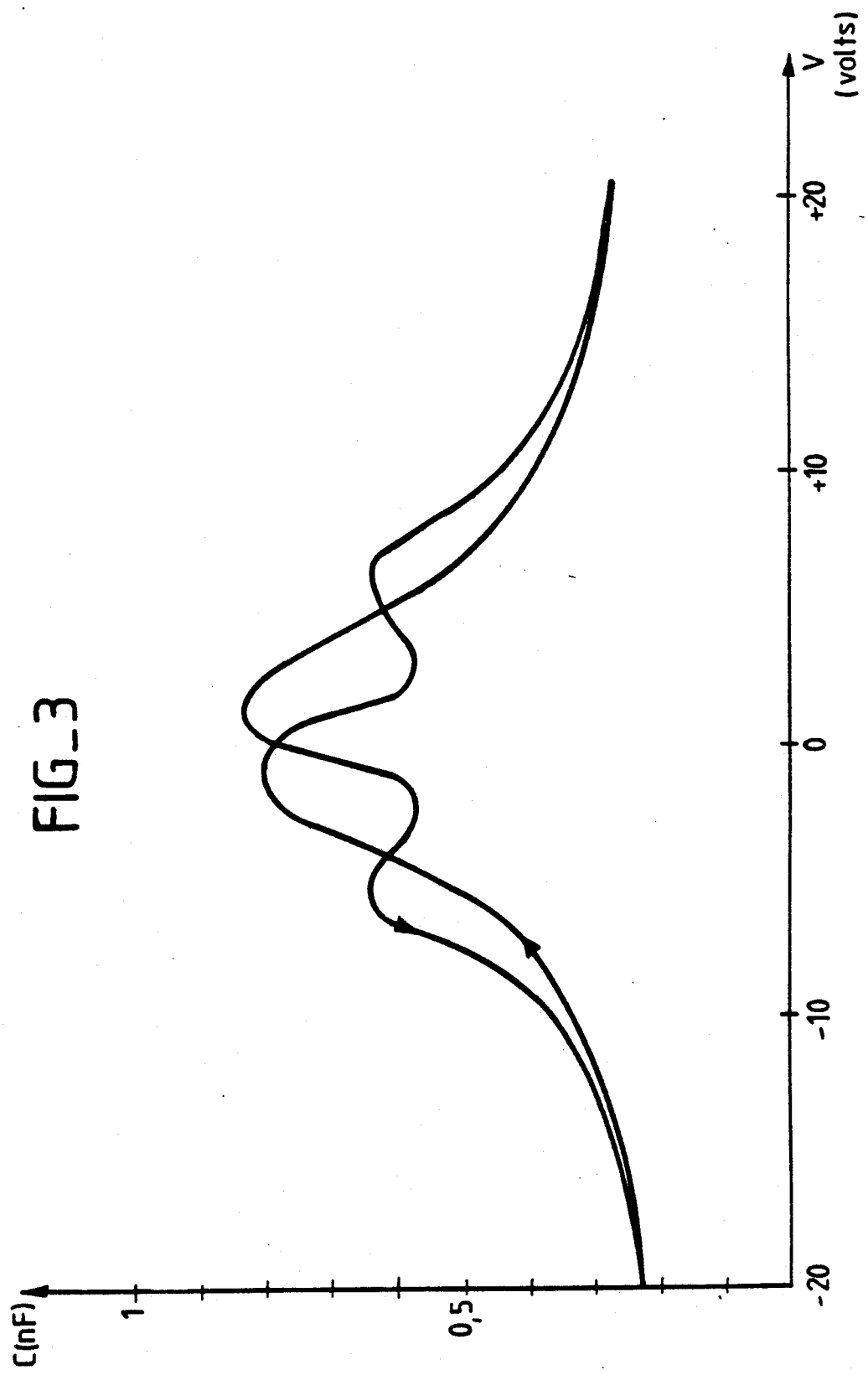
FIG_3

PROCESS FOR DEPOSITING A THIN LAYER OF A CERAMIC COMPOSITION AND A PRODUCT OBTAINED THEREBY

BACKGROUND OF THE INVENTION

Field of the Invention

The present invention provides a process for depositing a thin layer of a ceramic composition and a product obtained thereby.

Description of the Background

A large number of oxide ceramics have potential application in the microelectronics field. Among these, can be mentioned perovskites, which may be used in dielectric applications such as ferroelectrics $PbTi_xZr_{1-x}O_3$, or transparent conductive materials such as oxides of $In_xSn_{1-x}O$, or as superconductors Containing copper and oxides of elements such as (Y, Ba), (Bi, Sr, Ca), or (Ti, Ba, Ca).

These compounds must be deposited in thin layers on substrates such as aluminum oxide, silicon, or silica ($SiO_2$), on which buffer layers, such as other oxides or precious metals, may have been preliminarily deposited so as to act as electrical contacts (or insulators) or to provide better adhesion of the ceramic film on the substrate.

One widely-used technique for depositing ceramic films is serigraphy, in which oxide powders which have preliminarily undergone reaction are mixed with a binding agent and are applied to the substrate. Then, heating is effected to remove the organic binding agent and to obtain the sintering of the powder grains, thus giving an improved ceramic density, as well as improved electronic properties, and, if desired, optical properties such as transparency.

The reproducibility and reliability of the properties of films deposited in this way are linked to their microstructure and to the heat treatment to which the films are subjected.

Required integration into increasingly reduced systems dictates the use of initial submicronic powders so as to obtain a low degree of coarseness. However, this is obtained with difficulty when using conventional methods of synthesis based on mixtures of dry powders. Furthermore, the possible anisotropy of properties linked to an anisotropy of the crystalline structure of the material itself may require the texturing of the ceramic, by aligning the grains parallel to the substrate. This may be obtained by direct crystallization of the phases oriented by the substrate.

The crystallization and densification of the desired phase are carried out conventionally at temperatures approaching the melting point of the materials, in order to ensure the free mobility of the cations. Unfortunately, in the case of a deposit on a substrate, this also causes reactions with the substrate, or with other layers in the case of multilayer procedures.

Furthermore, the difference in coefficients of expansion of the various elements produces cracking at high temperatures. Therefore, a need exists for processes which utilize low temperatures of synthesis. Another reason for the observed cracking at high temperatures may be the volatility of some elements (Pb, Bi) at high temperatures.

One possible low-cost process for film deposition is synthesis using solutions in which the homogeneous mixture of elements makes it possible to ignore the problem of the ionic diffusion barrier, and thus, to lower the synthesis temperature. The difficulty then lies in obtaining solutions whose rheological properties allow the deposit of homogeneous films prior to thermal treatment.

Interesting precursors of these syntheses in solution are the alkoxides (sol-gel procedures). The hydrolysis of these precursors leads to the condensation of the polymeric lattices of oxides and hydroxides, the precursors of the desired phases. Nevertheless, it is sometimes not obvious that the hydrolysis rate must be controlled in the case of synthesis of complex phases containing a large number of elements possessing different properties. It is difficult to control simultaneously chemical homogeneity, which allow the synthesis temperature to be lowered, and the rheology desired for the deposit. Furthermore, alkoxides are not always easy to handle.

The procedure may thus begin with ionic solutions whose viscosity and elasticity have been modified by the presence of modifying agents added to the solvents (glycol, glycerol, citric acid), such as polyalcohols and polyacids, which lead to the production of polymer resins. However, not all of these additives are necessarily compatible with the cations. In addition, a solution is needed which adheres well to the substrate during deposit. This is a complicated procedure, and the substance obtained is deposited with difficulty using the method called "the spinning technique."

Thus, a need continues to exist for a process for depositing a thin layer of a ceramic composition in a simple manner which enables the combination of a large number of different chemical systems, while avoiding the drawbacks of the conventional methods.

SUMMARY OF THE INVENTION

Accordingly, it is an object of the present invention to provide an advantageous process for depositing a thin layer of a ceramic composition on a substrate.

It is also an object of this invention to provide a product composed of a ceramic composition in the form of a thin layer deposited on a substrate.

The above objects and others which will be described hereinbelow are provided by a process for depositing a thin layer of a ceramic composition on a substrate, which entails:

a) dissolving basic constituents of the ceramic composition, which are added in simple or mixed form to a solvent;

b) adding to the solution, acetylacetone and hexamethylene- tetramine in proportions suitable to the deposit method used;

c) maturing or polymerizing the substance obtained in step b);

d) depositing a layer of the substance on the substrate;

e) drying the deposited layer, and f) sintering the layer or layers deposited at low temperature.

BRIEF DESCRIPTION OF THE DRAWINGS

FIG. 1 is a diagram showing the loss of mass of a substance according to the present invention, and of its derivative, as a function of temperature;

FIG. 2 represents an hysteresis cycle; and

FIG. 3 is a diagram illustrating the variable capacitance of a ceramic composition deposited on silicon in accordance with the invention, as a function of voltage.

DETAILED DESCRIPTION OF THE PREFERRED EMBODIMENTS

The present invention provides a process for depositing a thin layer of a ceramic composition based on the use of an homogeneous solution whose rheology can be adapted to the "wafer-spinning" deposit of multi-compound systems. The cations are solubilized in a solution in which polymerization (or maturation) is caused by the reaction of two organic compounds: acetylacetane (ACAC) and hexamethylenetetramine (HMTA).

The two compounds (ACAC and HMTA) used in the invention procedure are preferably added in the optimal molar ratio of 2 moles of ACAC for 1 mole of HMTA. In an acidic medium, these compounds react, giving a polymeric species. Since, moreover, they form very good complexing agents, especially acetylacetone, independently of the cations, cations remain solubilized in the polymeric medium when it forms and during drying on the deposit substrate.

The scope of the present invention includes the replacement of one of these compounds, or even both, with another compound or compounds which produce the same effect and lead to the same result.

The present procedure is doubly advantageous. It facilitates, first, the adaptation to a large number of different systems, thereby making it possible to combine in solution, in a single synthesis, elements whose chemical behaviors are very different. Second, it facilitates an adaptation of the rheology. Once the synthesis is obtained, a polymer is formed which chelates the cations and whose concentration determines viscosity. The substance obtained is viscous and wetting, and it can then be modified by simple removal of the solvent. It does not change over time, thus allowing storage of the depositing solution and a rigorous control of its adaptation to the deposit method selected.

The present invention will now be further illustrated by reference to certain examples which are provided solely for purposes of illustration and are not intended to be limitative.

EXAMPLE 8.5 g of titanium tetrabutoxide Ti $(OBut)_4$ and 9.2 g of lead acetate are dissolved in 50 ml of acetic acid. Next, 10 ml of acetylacetone and 4 g of hexamethylenetetramine are added. The solution, yellow at the outset, turns red and becomes viscous, before reaching a stable state after several hours. Its viscosity can then be adjusted by evaporating the acetic acid. As used herein, the term "stable state" means a constant viscosity.

The substance obtained may be used as is for a wafer--spinning deposit (deposit conditions: 20 seconds, 2,000 rotations per minute) on substrates such as corundum and silicon preliminarily coated with platinum (by means of vacuum deposit), so as to ensure good electrical conduction.

Depending on the thickness of the entire layer to be deposited, it may be necessary to perform the deposit operation in several steps, and thus to dry each deposited layer before depositing a new one. Drying may take place at 300° C. in an oven.

Once the desired thickness of the layer is obtained, the layer undergoes sintering at a temperature of approximately 700°-750° C., an operation which does not alter the substrate on which the layer is deposited.

Thermal gravimetric analysis and differential calorimetry conducted on the lead titanate thus deposited show that one advantage of the method is the gradual and uniform loss of mass of the substance when the temperature increases.

In addition to acetic acid, propanol or methoxyethanol may be used as solvents.

FIG. 1 is a diagram giving, as a function of temperature, the curve of the loss of mass (curve 1 corresponding to the lefthand Y-axis) and its derivative curve (curve 2 corresponding to the right-hand Y-axis). Indeed, the gradual and uniform loss may be ascertained as a function of temperature. This shows an advantage of the present method, which consists in not causing an excessively violent oxidation of the organic portion, which would produce cracking in the film. The exothermal phenomena are completed at 700° C., temperature at which the phase is crystallized.

The thickness of the layers obtained may vary between 0.2 and 5 μm per layer. Thus, layers thicker than those produced by conventional sol-gel methods are obtained, but very thin layers can also be obtained because of the excellent surface quality of the layer.

The electric properties of the layers deposited on platinum (electrode deposited by cathodic spraying on an oriented silicon substrate 100) and directly on doped silicon (having a resistivity of less than 0.01Ωcm) are qiven in Table 1 at the end of the description. Electrical measurements are made on the silver metallization contacts deposited on the surface of the layer and which have a surface area of 7 $mm^2$. In this table, mention is made of the measured capacity C, the losses tg σ, the insulating resistance, the breakdown voltage $V_c$ in volts (for a ceramic layer whose thickness is approximately 1 μm), the voltage corresponding to the coercive field $V_{coerc}$, and the remanence R of the polarization (for the metal-insulator-metal structure on platinum) and of the capacitance (for the metalinsulator-semiconductor structure on silicon).

On platinum, because of the low value of the dielectric losses (3%), of the high value of the insulating resistance (100 MΩ) and of the breakdown voltage (40V), 60-Hz hysteresis cycles have been produced using the Sawyer and Tower method. One of these cycles is shown in FIG. 2, in which the Y-axis shows polarization P and the X-axis, the electric field E applied. Coercive voltage is at most equal to 16 V, and the remanent polarization is at least equal to 4.3 $\mu C/cm^2$.

On doped silicon, the capacitance value is slightly lower, probably because of a series capacitance caused in the semiconductor by interface states. A capacitance-memory effect has, however, been observed on this metal-insulator-semiconductor (MIS) structure. FIG. 3 is a diagram showing the capacitance C as a function of voltage. It will be noted that the capacitancevoltage curve is asymmetrical for rising and declining voltages between −20 volts and +20 volts. Peaks approaching + or −6 volts caused by the switching of ferroelectric ranges are superposed on the normal declining curve of the MIS structure.

The present invention makes it possible to create thin layers possessing large surface areas without defects and having a thickness of less than one micron on different metal (or metalcoated) semiconductor or insulator substrates, by means of a simple, low-cost procedure requiring widely-available and inexpensive raw materials. Applications include the fields of non-volatile memories, integrated optics, devices incorporating superconductors, and acoustic or pyroelectric detectors.

The deposits according to the invention have a low degree of surface coarseness and a very good surface quality because of the fineness and homogeneity of the ceramic grains.

|  | C (nF) | tgσ (%) | Ri (MΩ) | $V_c$ (V) | $V_{coerc}$ (V) | R |
| --- | --- | --- | --- | --- | --- | --- |
| On platinum | 1 | 1 | 100 | 40 | 16 | 0.3 μC  4.3 μC/cm² |
| On silicon | 0.8 | 9 | 1900 | 40 | 6 | 0.15 nF  (2.1 nF/cm²) |

Having described the present invention, it will now be apparent to one of ordinary skill in the art that many changes and modifications can be made to the above embodiments without departing from the spirit and the scope of the present invention.

What is claimed as new and desired to be secured by Letters Patent of the United States is:

1. A process for depositing a thin layer of a ceramic composition on a substrate of corundum, silicon or silicon coated with platinum, which consists essentially of:

a) dissolving constituents of an inorganically polymerizable ceramic composition in acetic acid or a mixture of acetic acid and propanol or acetic acid and methoxyethanol, to form an acidic solution of said constituents, b) adding to the solution acetylacetone and hexamethylene tetramine in amounts effective for said constituents to remain solubilized in the medium during subsequent polymer formation and during drying on the substrate;

c) maturing or polymerizing the solution obtained in step b) in the presence of said acidic solution until reaching a stable state;

d) depositing a layer of the matured or polymerized substance on the substrate;

e) drying the deposited layer; and f) sintering the deposited layer.

2. The process according to claim 1, wherein the proportions of acetylacetone and hexamethylenetetramine are 2 moles of acetylacetone to 1 mole of hexamethylenetetramine.

3. The process according to claim 2, wherein the ceramic composition is lead titanate, and titanium is added as titanium tetrabutoxide and lead is added as lead acetate, the solvent being acetic acid.

4. The process according to claim 1, wherein at least one additional layer of the substance is deposited on the substrate after drying the previously deposited layer.

5. The process according to claim 1, wherein said deposited layer is dried at 300° C.

6. The process according to claim 1, wherein said sintering is effected at 700°–750° C.

* * * * *